United States Patent
Bonaccio et al.

[11] Patent Number: 5,841,309
[45] Date of Patent: Nov. 24, 1998

[54] LOW VOLTAGE INPUT BUFFER FOR ASYMMETRICAL LOGIC SIGNALS

[75] Inventors: Anthony Richard Bonaccio, Shelburne; Wilbur David Pricer, Charlotte, both of Vt.

[73] Assignee: International Business Machines Corporation, Armonk, N.Y.

[21] Appl. No.: 769,976

[22] Filed: Dec. 19, 1996

[51] Int. Cl.[6] .................................................. H03K 17/16
[52] U.S. Cl. ...................... 327/333; 327/543; 327/108; 327/362; 326/68; 326/34
[58] Field of Search ................................. 327/108, 53, 66, 327/362, 333, 205, 206, 73, 538, 543; 326/31, 34, 68, 62, 63, 80

[56] References Cited

U.S. PATENT DOCUMENTS

| | | | |
|---|---|---|---|
| 4,713,600 | 12/1987 | Tsugaru et al. ........................... | 323/351 |
| 4,763,021 | 8/1988 | Stickel ....................................... | 326/71 |
| 4,792,704 | 12/1988 | Lobb et al. ............................... | 327/333 |
| 5,341,045 | 8/1994 | Almulla ..................................... | 326/68 |
| 5,341,047 | 8/1994 | Rosenthal ................................. | 326/68 |
| 5,386,153 | 1/1995 | Voss et al. ................................ | 326/34 |
| 5,467,044 | 11/1995 | Ashe et al. ............................... | 327/333 |

*Primary Examiner*—Dinh Le
*Attorney, Agent, or Firm*—Robert A. Walsh

[57] ABSTRACT

An input buffer circuit has a switching point accurately set according to the input logic level, even when the input buffer circuit has a low supply voltage. The switching point is set according to an internal reference voltage of equal magnitude to the desired switching point that is applied to a current source. The current source accurately sources (or sinks) a current matching the current flowing in an input inverter when the input logic level substantially equals the reference voltage. At that point, the voltage at the output of the input inverter is substantially equal one half of the supply voltage. When the input logic level is slightly below or above the reference voltage, the output of the input inverter is near the supply or ground rail, respectively. Hysteresis is added to compensate for noise that may exist on the input logic signal.

10 Claims, 5 Drawing Sheets

LOW VOLTAGE INPUT BUFFER FOR ASYMMETRICAL LOGIC SIGNALS

FIELD OF THE INVENTION

The present invention relates generally to input buffer circuits, and more particularly, to an input buffer having a reference current source for precisely controlling an input voltage switching point.

BACKGROUND OF THE INVENTION

Several different integrated circuit technologies are available to circuit and system designers in which to realize their designs. These technologies include for example, bipolar, complementary metal oxide semiconductor (CMOS), bipolar-CMOS (Bi-CMOS), gallium arsenide (GaAs), and others. As would be expected, integrated circuits based on differing technologies, or based on differing logic families within a technology, are often required to operate within a single system, and hence must communicate one with another. A common problem that must be dealt with is the differing logic level voltages associated with the differing technologies, or between differing circuit families within a single technology. This problem is sometimes further exacerbated by supply voltage levels which may vary significantly, not only between different technologies, but even among circuits of like technologies. In order to deal with such differences between circuits and technologies, designers rely upon input buffer circuits that are capable of translating input signal levels from an external circuit into needed logic levels of internal circuits.

The input signal levels from the external source need to be made compatible with internal switching levels, typically at the input buffer circuit. One CMOS inverter solution for modifying the circuit threshold voltages involves simply ratioing the two transistors making up an inverter at the input as shown in FIG. 1. Here, the width to length (W/L) ratio of P-type transistor 101 is made much larger than the W/L ratio of N-type transistor 102. The actual affect of this technique upon the switching point is small. This technique, however, also causes vastly unsymmetrical performance because the much larger P-type transistor 101 provides for a much faster rise time than a corresponding fall time provided by N-type transistor 102.

Circuit switching points can be more dramatically affected by resorting to some form of difference amplifier or comparator circuit. The comparator circuit depicted in FIG. 2 works very well for a wide range of input logic levels so long as the power supply voltage levels are maintained at a sufficiently high magnitude. Under reduced power supply environments, for example, below 3.0 volts, which is becoming more common to accommodate shorter transistor channel lengths, the performance of the circuit depicted in FIG. 2 is greatly degraded. Assuming a 2.5 volt supply voltage for the comparator circuit of FIG. 2, and given a TTL level input or a signal from a CMOS chip having a supply voltage at 3.0 volts, a logic swing around 1.5 volts would be expected. Therefore, the reference voltage is similarly set at 1.5 volts to effect the switching point thereat. Assuming further transistor threshold voltages of approximately 0.8 volts, then one would expect that during transients switching of transistors 201 and 202, that transistor 205 is switched on by a mere 100 milli-volts or thereabout. Performance would thus be slow. Any variation in the 2.5 volt power supply would cause performance to be both slow and erratic.

The circuit depicted in FIG. 2 will not provide high performance operation when used with low voltage power supplies. The fundamental problem is that either differential input transistor 205 or 206 will have an applied gate voltage that is reduced from the rail-to-rail supply voltage by at least a factor of two due to the stacking of transistors. Also, because this is a comparator circuit, current must be flowing in the common mode resistance (transistor 203) at the time of comparison. At supply voltages below about 2.5 volts, the comparator circuit becomes inoperative.

Accordingly it is desired to provide an input circuit that works well for a wide range of input logic levels, even for supply voltage below 2.5 volts, and whose switching point can be adjusted to accommodate a wide range of input logic levels.

SUMMARY OF THE INVENTION

An object of the present invention is to provide an improved input circuit for translating input logic levels.

Another object of the present invention is to provide an input circuit whose switching point is made to follow changes in input logic levels.

Still another object of the present invention is to provide an input circuit that operates over a wide range of input logic levels at low supply voltages by using a current source to offset an output current of an input inverter that receives the input logic level.

According to a first embodiment of the present invention, a method is provided in a semiconductor circuit for accurately modifying a switching point of an input buffer circuit to match a received external logic input having a different switching point than the normal or unmodified switching point of the input buffer circuit. The method includes deriving a reference voltage having a voltage magnitude substantially equal to the voltage magnitude of the desired switching point. The derived reference voltage is used for biasing a current source within the semiconductor circuit. The current source provides a matching current that is substantially equal to a current flowing in an input inverter of the input buffer circuit when the voltage magnitude of the logic input is substantially equal to the voltage magnitude of the reference voltage and hence the desired switching point. The input inverter will have a voltage output substantially equal to one half the supply voltage at the switching point. The logic input will otherwise be internally translated into a first logical level when the logic input is at least slightly above the switching point and into a second logical level when the logic input is slightly below the switching point.

According to another embodiment of the present invention, an integrated circuit having a first natural switching point includes an input buffer circuit for receiving a logic input from an external source, wherein the external source has a second natural switching point. The input buffer circuit includes an input device that receives the logic input. A current flows within the input device according to a voltage magnitude of the logic input. A current source is connected to an output of the input device wherein the current source is biased by a reference voltage. The voltage magnitude of the reference voltage is substantially equal to a voltage magnitude of the second natural switching point. The current source provides a mirrored current to the output of the input device which is substantially equal to a current of the input device when the logic input is substantially equal to the reference voltage.

The foregoing and other objects, features, and advantages of the invention will be apparent from the following more particular description of a preferred embodiment of the invention, as illustrated in the accompanying drawing.

DETAILED DESCRIPTION

Figure 3A:
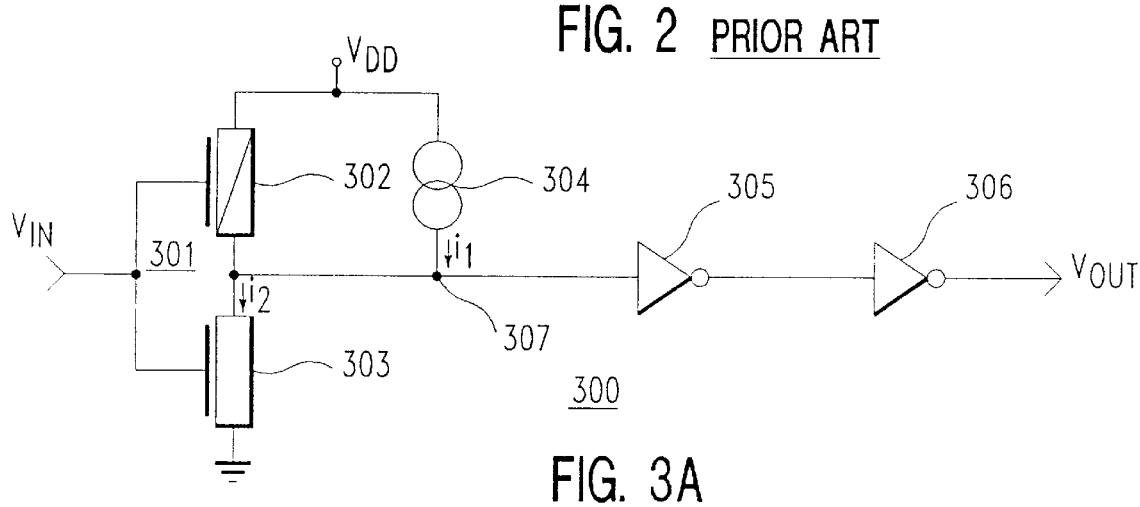
FIGS. 3A and 3B are logic diagrams of a preferred embodiment of the present invention.

Referring now to the figures, and for the present to FIG. 3A, a block diagram of an input buffer circuit 300 is shown that has an ability to operate over a wide range of input logic levels even when its supply voltage is low. The wide operating range of the input buffer circuit 300 is accomplished, in part, by using a current source 304 to offset an output current of an input inverter 301 that receives the input logic level. The input inverter 301 is made up of series connected transistors 302 and 303. The output of the inverter 301 is connected to the current source 304, and further connected to series connected inverters 305 and 306.

The current source 304 is biased by a reference voltage having a magnitude equal to the switching point of the input logic levels, and hence the desired switching point between the input inverter 301. Generally, the switching point of the input logic level and of the input inverter will be substantially equal to one half of the respective power supply voltages. These switching points can thus be considered the "natural switching points" of the respective circuits. When the input signal to the inverter 301 is approximately equal to the reference voltage supplied to the current source 304, then the magnitude of a current, $i_1$, sourced by the current source 304, will approximately equal a current, $i_2$, sinked by the inverter 301. Therefore, the current at the output of the inverter 301, node 307, will be approximately zero. The voltage at node 307 will be substantially equal to one half of the supply voltage, for example 1.25 volts given a 2.5 volt supply voltage. A change in the input logic level, even slightly above or below the reference voltage, will cause the voltage at node 307 to be near ground (for example, zero volts) or near the supply voltage (for example, 2.5 volts), respectively. This occurs since a differential exists between the currents $i_1$ and $i_2$, wherein $i_1$ is constant and $i_2$ changes according to the magnitude of the input logic level.

Figure 3B:
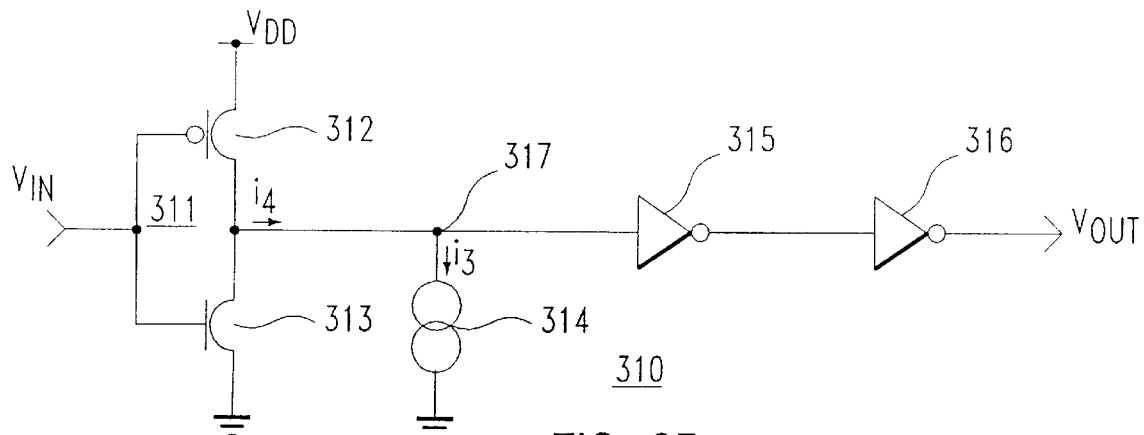

FIG. 3B is a logic diagram of an input buffer 310 that operates similarly to the input buffer 300. In this case a current source 314 is connected between the output of an input inverter 311 and the ground supply. Once again the current source 314 is biased by a reference voltage substantially equal to the desired switching point of the input logic level. Now, however, instead of sourcing a current $i_1$, the current source sinks a current $i_3$ that is substantially equal to a current $i_4$ sourced by the inverter 311. The result is very similar—the voltage at node 317, when the input logic level is substantially equal to the reference voltage, is substantially equal to one half of the supply voltage, using the previous example, 1.25 volts. A change in the input logic level, even slightly above or below the reference voltage, will cause the voltage at node 317 to be near ground (for example, zero volts) or near the supply voltage (for example, 2.5 volts), respectively. The inverters 315 and 316 act to further shape the signal and provide more current drive to the signal at node 317.

The input buffers 300 and 310 of FIGS. 3A and 3B, respectively, effectively modify internal switching levels to be compatible with input signal levels from the external source. This is accomplished independently of transistor threshold levels which could otherwise be adversely affected by process parameters and environmental conditions. Additionally, internal switching levels remain compatible with external logic levels under adverse conditions. For example, substantial variations in the supply voltage can occur while maintaining the desired switching levels since the switching level is based upon the reference voltage. Such reference voltage can be generated internally on chip, or derived from the external signal source so that internal switching levels will track external voltage conditions (e.g., a voltage divider of the external supply voltage). In fact, the input buffer 300 of FIG. 3A will continue to operate properly even when the input logic level switching point exceeds internal supply voltages provided to the input buffer 300. The input buffer 310 of FIG. 3B would be appropriate, and would provide proper operation, in cases where the input logic level switching point falls below internal voltages provided to the input buffer 310.

Figure 1:
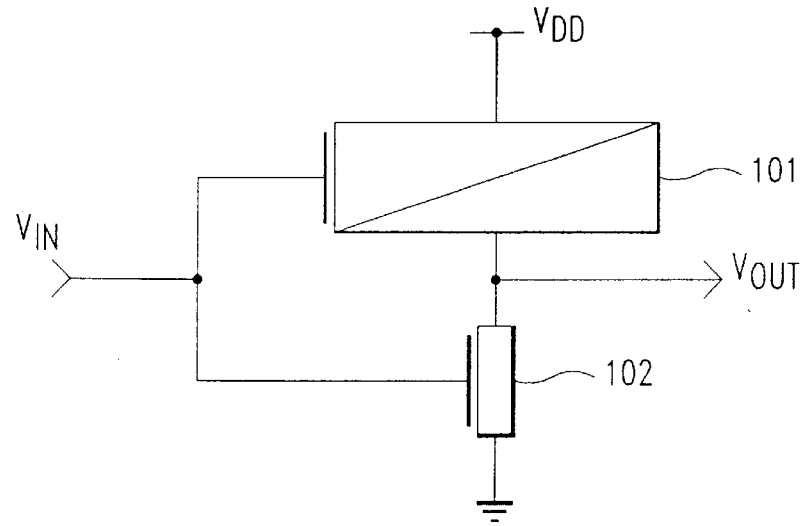
FIG. 1 is a circuit diagram of a prior art input inverter.
Figure 4:
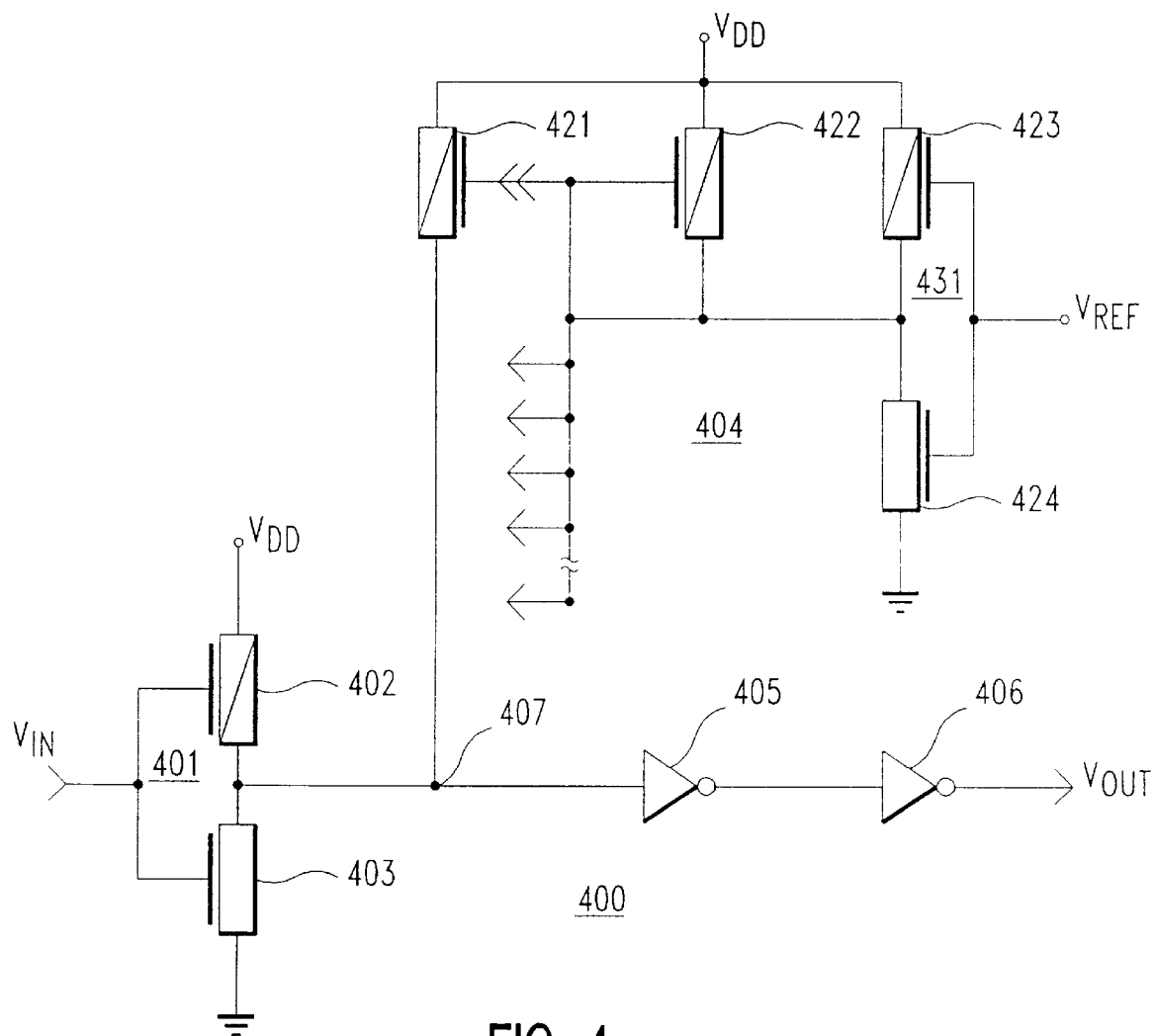
FIG. 4 is a circuit diagram of the input buffer circuit of FIG. 3A.
Figure 2:
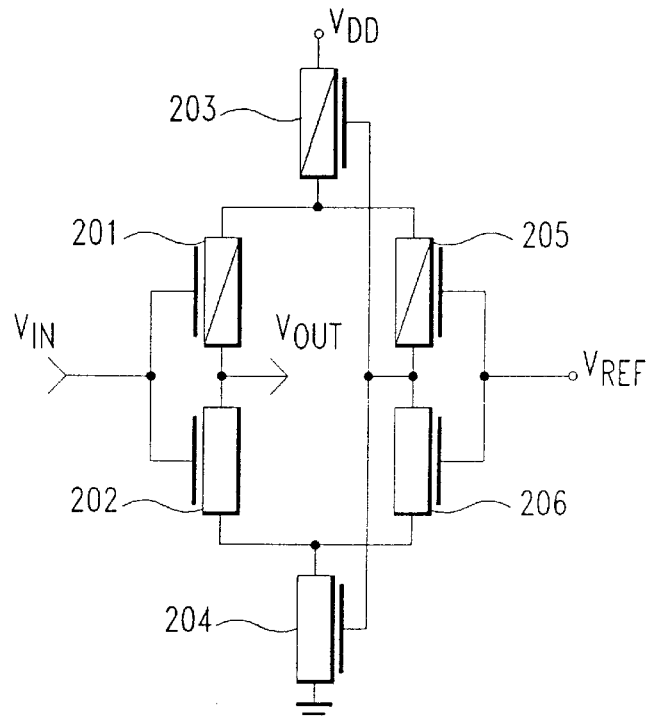
FIG. 2 is a circuit diagram of a prior art comparator circuit for translating input logic levels.

Referring now to FIG. 4, an input buffer 400 is shown with a current source with the connected reference voltage ($V_{ref}$) shown in greater detail. The current mirror 404 is connected to the output node 407 of the input inverter 401 which is made up of series connected transistors 402 and 403. The current source 404 includes an inverter 431 made up of series connected transistors 423 and 424, wherein the inverter 431, for best performance, is matched to the input inverter 401. The input of the inverter 431 is connected to $V_{ref}$ for setting up the internal switching point of the input inverter 401. An output of the inverter 431 is connected to a current mirror realized by diode connected transistor 422 and source transistor 421. Note that only a single current source 404 is required for many input buffer circuits and only an equivalent transistor 421 is required for each additional input buffer.

The ability of the input buffer 400 to handle asymmetrical input signals while itself operating from a low supply voltage, for example, 2.5 volts, is enabled because the "drive" transistors (402, 403), and the "sensing" transistors (423, 424) are directly connected between the input signal and the corresponding drive rails. This eliminates prior art problems associated with stacked transistors, including additional transistor threshold voltage losses and associated resistances. Additionally, the inverter 431, the sensing device, is static and is not part of the switching circuit (inverter 401). Still further, the magnitude of the current required to be delivered by the current mirror (i.e., transistor 421) is small relative to the drive capability of the inverter 401. This is true since transistor 421 only need deliver the current that is drawn by the inverter 401 at the switching point. This current that is contributed by the transistor 421, however, can be of concern in low power applications.

While the input buffer circuit 400 shown in FIG. 4 is a more detailed representation of the input buffer circuit 300 shown in FIG. 3A, one can now readily see that the input buffer circuit 310 depicted in FIG. 3B would be similarly realized. The only change being that the current mirror portion of the current source 404 would instead be comprised of N-channel transistors having their sources connected to the ground supply terminal.

Figure 5:
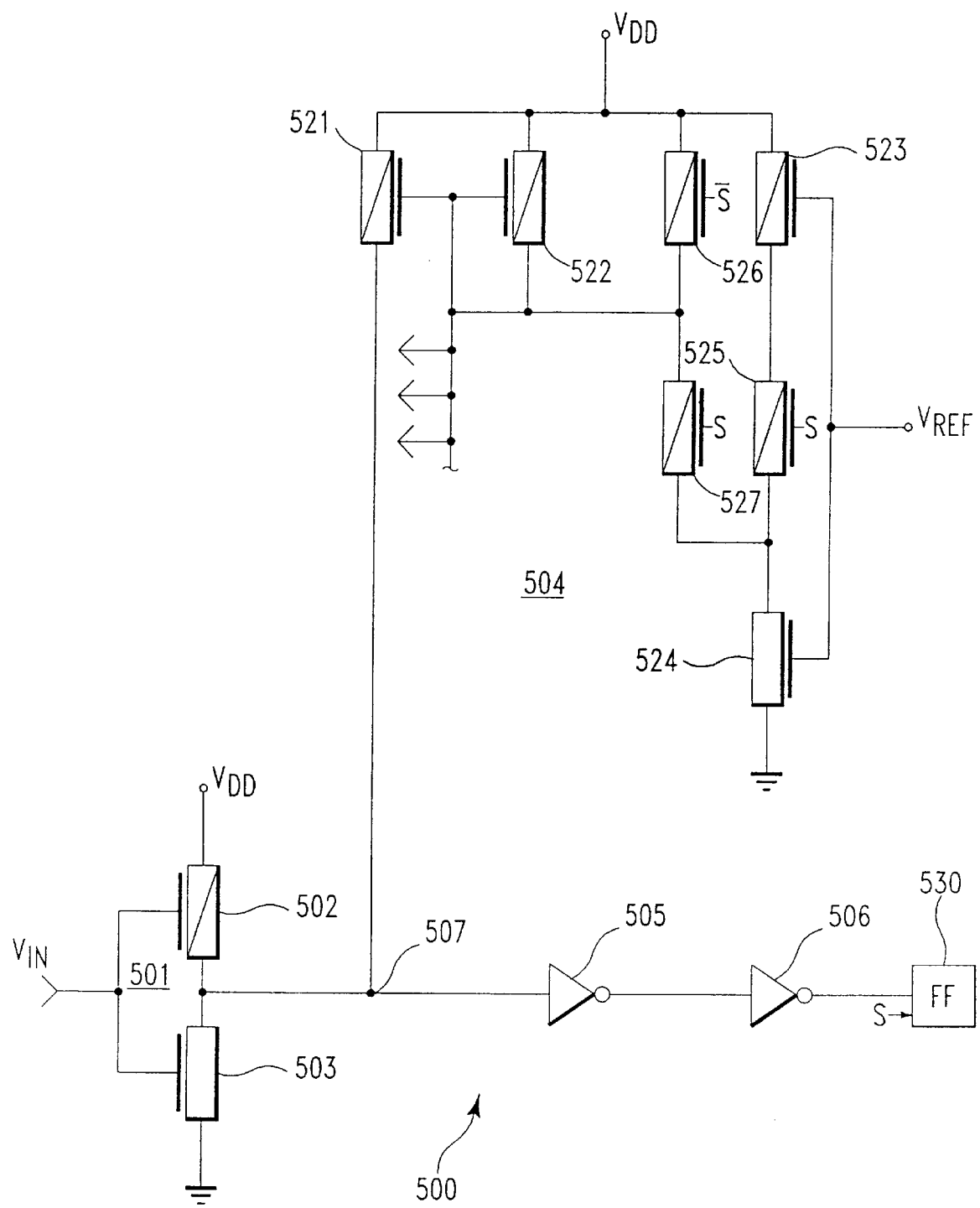
FIG. 5 is a circuit diagram of the buffer circuit of FIG. 4 with additional power down mode capability.

FIG. 5 depicts an input buffer circuit 500 having a power down mode for reducing undesired static power dissipation. Except for transistors 525–527 and flip-flop 530 (or other storage element), the input buffer circuit 500 is identical to the input buffer curcuit 400. Having a means to reduce static power dissipation in the input buffer circuit 500 is especially important on those integrated circuits having many input or input/output pads. When the input buffer circuit 500 is receiving a valid external logic signal the S signal is at a logical low (and hence S-bar is at a logical high) so that transistors 525 and 527 are enabled and transistor 526 is disabled. The current source 504 is allowed to operate normally and the flip-flop 530 is able to receive the output of inverter 506. Once the input logic signal has been available at least long enough to be properly processed by the input buffer circuit 500, the S signal may go high such that the current source 504 is disabled and transistor 526 acts as a pull-up device. The input logic signal is now properly saved in the flip-flop 530 and the input logic signal no longer needs translation. Unnecessary static current flow in input buffer circuit 500 is thus reduced. As is known to those skilled in the art, transistors 523 and 524 will have to be sized to account for the addition of transistors 525 and 527.

Figure 6:
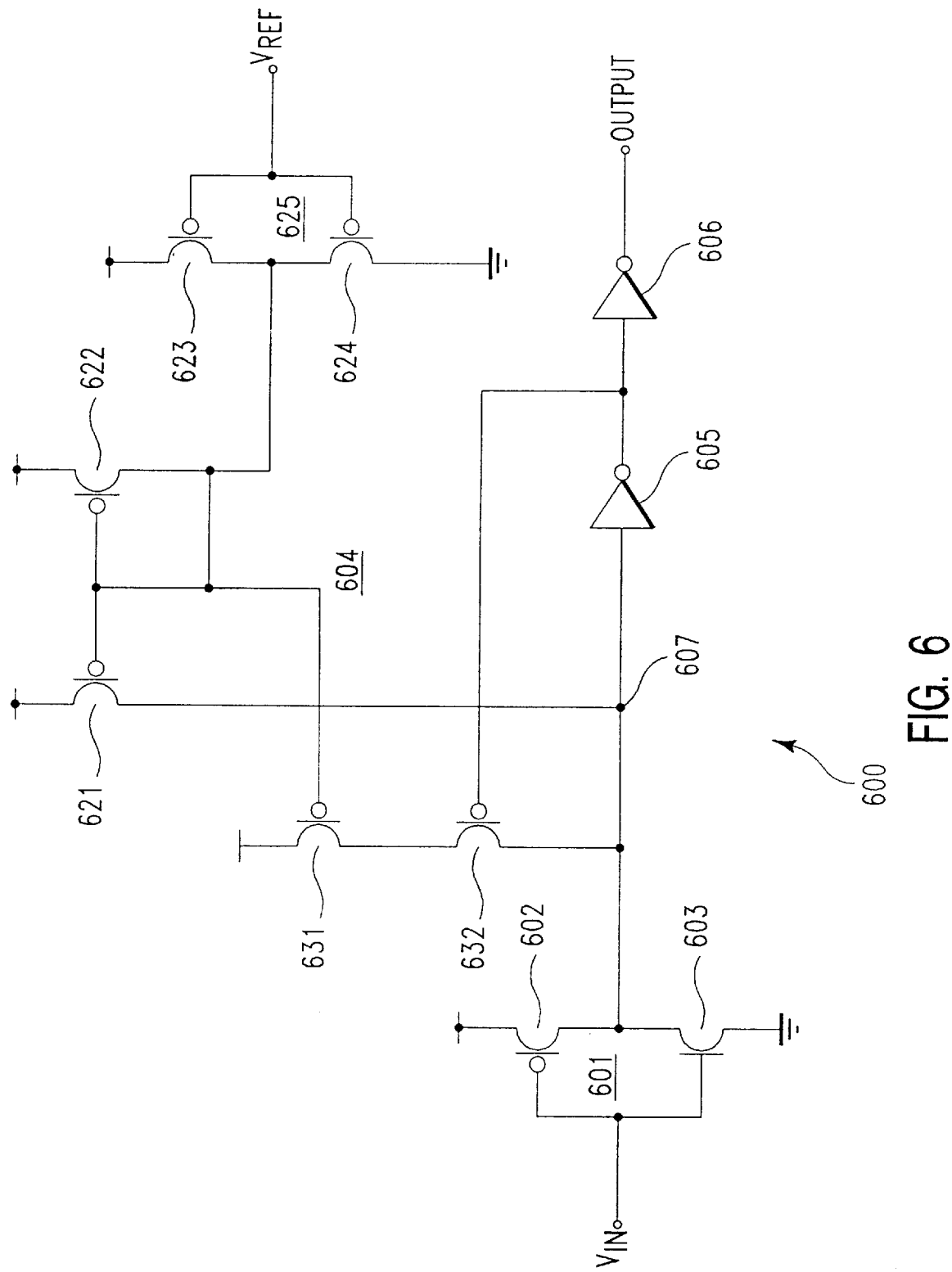
FIG. 6 is a circuit diagram of an input buffer circuit having hysteresis tracking.

The input buffer circuit 600, shown in FIG. 6, improves the performance of the input buffer circuit 400 as shown in FIG. 4 when noise levels on the input logic levels is a concern. Noise on the input logic level can of course cause false switching. In the embodiment shown in FIG. 5, the data latched in the flip-flop 530 could be in error if noise were present at the time of latching. Noise problems at input circuits are typically solved by introducing hysteresis via feeding an output voltage back to a storage element at the input. The input buffer circuit 600 is identical to the input buffer circuit 400 with the addition of hysteresis. The switching point of the input inverter 601 is likewise precisely controlled by the current source 604 via the reference voltage, $V_{ref}$. The hysteresis provided tracks the modified switching point.

The switching point, as previously described, is accomplished by sourcing (or sinking) a precisely controlled current at the output of the input inverter 601, and providing a hysteresis that tracks the modified switching point is accomplished by making a portion of the precisely controlled current a function of the output level of the input inverter 601. More specifically, transistors 631 and 632 are added, and transistor 621 is modified for accomplishing the desired hysteresis result. Essentially, an initial amount of the precisely controlled current is adjusted so that the desired switching point occurs centered within a "hysteresis box".

Transistor 631, similar to transistor 621, has a gate connected to diode connected transistor 622 for forcing additional current into the node 607. This has the affect of increasing the magnitude of the switching point. Transistor 632, which is in series between transistor 631 and node 607, is controlled by a state of the inverter 601 (through inverter 605). Hysteresis is created by this positive feedback. Positioning the switching point within the "hysteresis box" is accomplished by the relative sizing of transistors 621, 622 and 631. For example, creating a hysteresis box from ninety percent for an input logic high to one hundred ten percent for an input logic low (i.e., plus and minus ten percent around the switching point) is realized by sizing transistor 621 to provide ten percent less current than transistor 622 and sizing transistor 631 to provide twenty percent of the current of transistor 622. For example, given fixed transistor lengths, and a transistor 622 width equal to ten microns, then transistor 621 is sized at nine microns and transistor 631 is sized at two microns. Other hysteresis box limits, symmetrical or otherwise, can be realized then by appropriate transistor sizing.

Figure 7:
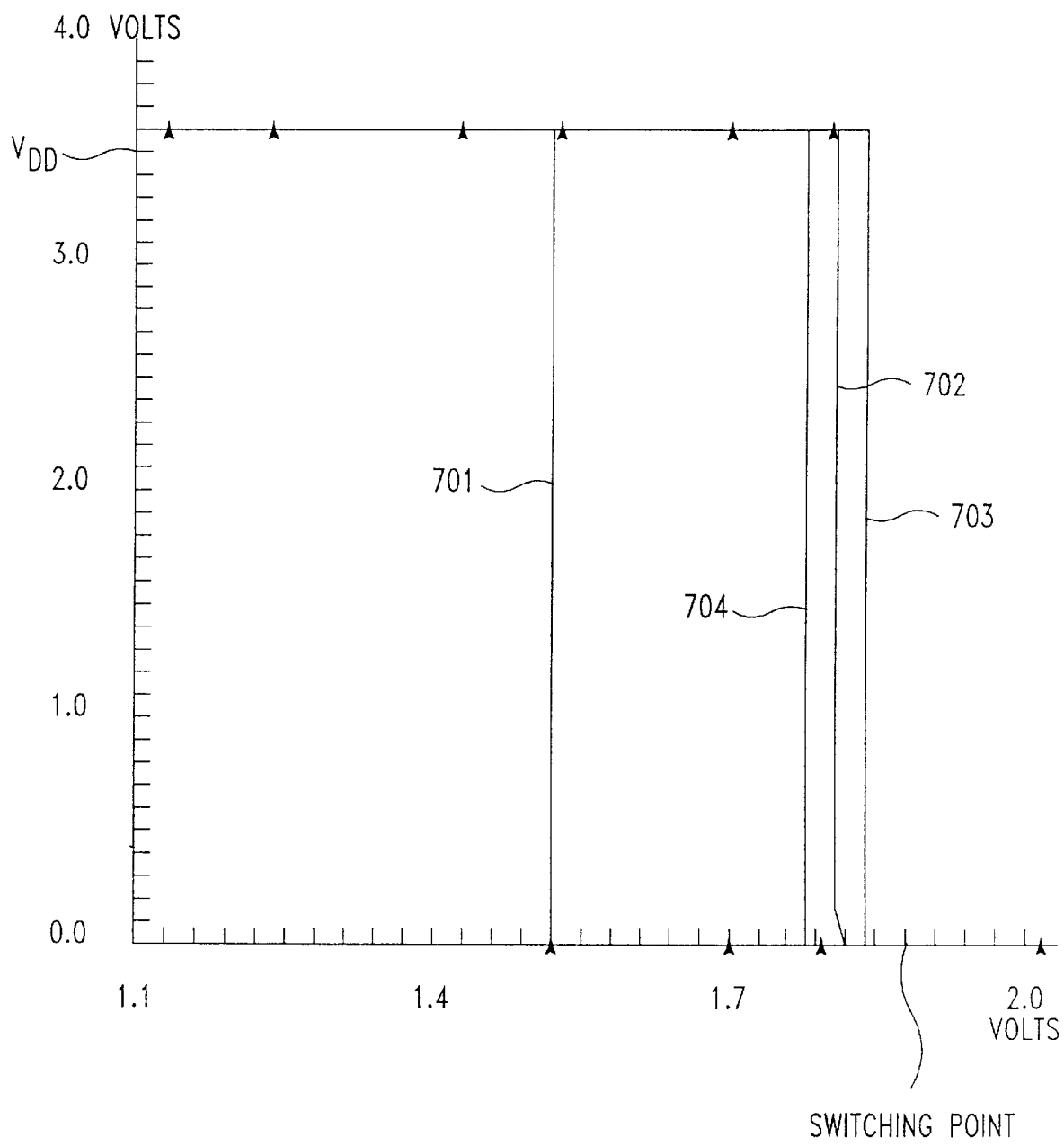
FIG. 7 is a static (DC) response curve showing the hysteresis effects on the input buffer circuit.

FIG. 7 is a static (DC) response curve showing the simulation results of the input buffer circuit 600 having hysteresis. In this simulation example, a power supply voltage ($V_{DD}$) is set for 3.6 volts (Y-axis) with the X-axis showing the switching point magnitude. A desired switching point equal to 1.5 volts, curve 701, is achieved with no hysteresis present. Curve 702 shows that the switching point is successfully shifted to equal approximately 1.8 volts and hysteresis is added. Curves 703 and 704 show the boundaries of the "hysteresis box".

While the invention has been particularly shown and described with reference to preferred embodiments thereof, it will be understood by those skilled in the art that various changes in form and details may be made therein without departing from the spirit and scope of the invention. For example, the current source may vary in form so long as a mirrored current is provided. As is known in the art many current mirror variations are available. Additionally, the current mirror may be coupled between the positive supply voltage or ground and the output of the input inverter according to the results desired. Still further, dual current mirrors may be provided, one at each supply rail, that are selectively enabled according to the desired switching point being sought. Voltage magnitudes a given as examples, including input logic levels, and are not meant to be invention limitations. Changes in future embodiments of the invention can therefore be made without departing from the teachings herein.

What is claimed is:

1. A method of accurately setting a voltage switching point at a predetermined voltage magnitude for an input buffer circuit having an inverter for receiving a logic input signal to provide an output current at an output terminal, said method comprising the steps of:

(a) providing a reference voltage, said reference voltage having a voltage magnitude substantially equal to the predetermined voltage magnitude of the voltage switching point;

(b) biasing a mirrored current source with the reference voltage to provide a mirrored current;

(c) supplying said current source from said mirrored current source to said output terminal, said mirrored current being substantially equal to said output current of the inverter when the voltage magnitude of the reference voltage is substantially equal to the predetermined voltage magnitude of the voltage switching point voltage for off-setting the output current; and (d) translating the logic input signal into an output voltage level at the output terminal when the logic input signal is slightly below the predetermined voltage magnitude of the voltage switching point.

2. The method according to claim 1 wherein the reference voltage is derived from an internal supply voltage.

3. The method according to claim 1 wherein the reference voltage is derived from an external supply voltage.

4. The method according to claim 1 wherein said mirrored current is a sinked current.

5. The method according to claim 1 wherein the logic input signal is substantially higher than the voltage switching point.

6. An input buffer circuit for receiving a logic input signal at an input terminal having a first voltage switching point, the input buffer circuit translating the logic input signal into a second voltage switching point, said input buffer circuit comprising:

an input inverter connected to the input terminal for providing an output current at an output terminal of said input inverter; and a mirrored current source coupled to said output terminal of said input inverter, said mirrored current source biased by a reference voltage, wherein the reference voltage is substantially equal to a voltage magnitude at the first voltage switching point, said current mirrored source providing a mirrored current to the output terminal of said input inverter, said mirrored current having a current magnitude substantially equal to a current magnitude of the output current for offsetting the output current when the voltage magnitude of the first voltage switching point is substantially equal to the reference voltage.

7. The input buffer circuit according to claim 6 wherein a voltage magnitude of said second voltage switching point is less than the voltage magnitude of said first voltage switching point.

8. The input buffer circuit according to claim 6 wherein a voltage magnitude of said second voltage switching point is greater than the voltage magnitude of said first voltage switching point.

9. The input buffer circuit according to claim 7 wherein said reference voltage is derived from an internal supply voltage.

10. The input buffer circuit according to claim 6 wherein the reference voltage is derived from an external supply voltage.

* * * * *